US010253412B2

(12) United States Patent
Thomas et al.

(10) Patent No.: US 10,253,412 B2
(45) Date of Patent: Apr. 9, 2019

(54) DEPOSITION APPARATUS INCLUDING EDGE PLENUM SHOWERHEAD ASSEMBLY

(71) Applicant: Lam Research Corporation, Fremont, CA (US)

(72) Inventors: Timothy Scott Thomas, Wilsonville, OR (US); Karl Leeser, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 414 days.

(21) Appl. No.: 14/720,584

(22) Filed: May 22, 2015

(65) Prior Publication Data

US 2016/0340781 A1   Nov. 24, 2016

(51) Int. Cl.
| | |
|---|---|
| *C23C 16/455* | (2006.01) |
| *C23C 16/505* | (2006.01) |
| *C23C 16/52* | (2006.01) |
| *C23C 16/44* | (2006.01) |

(52) U.S. Cl.
CPC .... *C23C 16/45565* (2013.01); *C23C 16/4408* (2013.01); *C23C 16/45519* (2013.01); *C23C 16/505* (2013.01); *C23C 16/52* (2013.01)

(58) Field of Classification Search
CPC .......... C23C 16/4408; C23C 16/45519; C23C 16/45565; C23C 16/52; C23C 16/505
See application file for complete search history.

(56) References Cited

U.S. PATENT DOCUMENTS

| | | | | |
|---|---|---|---|---|
| 4,960,488 A | * | 10/1990 | Law | C23C 16/402 134/1 |
| 5,747,362 A | * | 5/1998 | Visser | C23C 16/455 204/298.07 |
| 5,926,743 A | * | 7/1999 | Xi | C23C 16/4405 134/1.1 |
| 6,190,732 B1 | | 2/2001 | Omstead et al. | |

(Continued)

FOREIGN PATENT DOCUMENTS

JP    WO 03012165 A1 * 2/2003 ............. C23C 16/14

*Primary Examiner* — Jeffrie R Lund
(74) *Attorney, Agent, or Firm* — Buchanan Ingersoll & Rooney LLP (57) ABSTRACT

A deposition apparatus for processing substrates includes a vacuum chamber including a processing zone in which a substrate may be processed. First and second gas sources are in fluid communication with the vacuum chamber. The first gas source is operable to supply a first gas into the vacuum chamber and the second gas source is operable to supply a second gas into the vacuum chamber. A showerhead assembly includes a face plate and back plate. The back plate includes a first gas inlet in fluid communication with the first gas source and a second gas inlet in fluid communication with the second gas source. The face plate includes a lower wall and an outer wall extending vertically upwardly from an outer periphery of the lower wall. The outer wall is sealed to an outer periphery of the back plate such that an inner plenum and an edge plenum are formed between the face plate and the back plate. The face plate includes a first gas permeable region in fluid communication with the first gas inlet via the inner plenum such that the first gas may be supplied therethrough during processing and a second gas permeable region in fluid communication with the second gas inlet via the edge plenum such that a second gas may be supplied therethrough during processing. A substrate pedestal assembly is configured to support a substrate on an upper surface thereof when a substrate is processed in the deposition apparatus.

17 Claims, 5 Drawing Sheets

(56) References Cited

U.S. PATENT DOCUMENTS

| | | | |
|---|---|---|---|
| 6,796,316 B2* | 9/2004 | Park | C23C 16/4405 134/2 |
| 6,860,965 B1 | 3/2005 | Stevens | |
| 7,651,568 B2* | 1/2010 | Ishizaka | C23C 16/4404 118/715 |
| 8,163,087 B2* | 4/2012 | Faguet | C23C 16/4401 118/715 |
| 8,197,636 B2* | 6/2012 | Shah | H01J 37/32366 118/719 |
| 8,317,968 B2 | 11/2012 | Dhindsa et al. | |
| 8,840,754 B2 | 9/2014 | Hao | |
| 9,388,494 B2* | 7/2016 | Xia | C23C 16/4401 |
| 9,695,510 B2* | 7/2017 | Rayner, Jr. | C23C 16/452 |
| 2002/0007790 A1* | 1/2002 | Park | C23C 16/4405 118/715 |
| 2005/0173569 A1* | 8/2005 | Noorbakhsh | C23C 16/45565 239/690 |
| 2005/0241765 A1* | 11/2005 | Dhindsa | H01J 37/32009 156/345.34 |
| 2005/0241766 A1* | 11/2005 | Dhindsa | H01J 37/32009 156/345.34 |
| 2005/0268856 A1* | 12/2005 | Miller | C23C 16/45544 118/729 |
| 2007/0256785 A1* | 11/2007 | Pamarthy | H01J 37/3244 156/345.33 |
| 2009/0159002 A1* | 6/2009 | Bera | H01J 37/3244 118/715 |
| 2009/0218314 A1* | 9/2009 | Davis | G01N 21/73 216/60 |
| 2011/0056626 A1 | 3/2011 | Brown et al. | |
| 2011/0162800 A1* | 7/2011 | Noorbakhsh | C23C 16/45565 156/345.34 |
| 2012/0118510 A1* | 5/2012 | Banda | B32B 38/10 156/704 |
| 2015/0007770 A1 | 1/2015 | Chandrasekharan et al. | |
| 2015/0099372 A1 | 4/2015 | Chandrasekharan et al. | |
| 2015/0329966 A1* | 11/2015 | Shah | C23C 16/45565 118/730 |
| 2016/0340781 A1* | 11/2016 | Thomas | C23C 16/45565 |

* cited by examiner

DEPOSITION APPARATUS INCLUDING EDGE PLENUM SHOWERHEAD ASSEMBLY

FIELD OF THE INVENTION

This invention pertains to substrate processing apparatuses for processing substrates, and may find particular use in plasma-enhanced chemical vapor depositions processing apparatuses operable to deposit thin films.

BACKGROUND

Substrate processing apparatuses are used to process substrates, such as semiconductor, glass, or polymer substrates, by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of substrate processing apparatus is a plasma processing apparatus that includes a reaction chamber containing upper and lower electrodes wherein a radio frequency (RF) power is applied between the electrodes to excite a process gas into plasma for processing substrates in the reaction chamber.

SUMMARY

Disclosed herein is a deposition apparatus for processing substrates. The deposition apparatus includes a vacuum chamber including a processing zone in which a substrate may be processed. First and second gas sources are in fluid communication with the vacuum chamber. The first gas source is operable to supply a first gas into the vacuum chamber during processing and the second gas source is operable to supply a second gas into the vacuum chamber during processing. A showerhead assembly includes a face plate and back plate. The back plate includes a first gas inlet in fluid communication with the first gas source and a second gas inlet in fluid communication with the second gas source. The face plate includes a lower wall and an outer wall extending vertically upwardly from an outer periphery of the lower wall. The outer wall is sealed to an outer periphery of the back plate such that an inner plenum and an edge plenum are formed between the face plate and the back plate. The face plate includes a first gas permeable region in fluid communication with the first gas inlet via the inner plenum such that the first gas may be supplied therethrough during processing and a second gas permeable region in fluid communication with the second gas inlet via the edge plenum such that a second gas may be supplied therethrough during processing. The inner and edge plenums are not in fluid communication with each other. A substrate pedestal assembly is configured to support a substrate on an upper surface thereof when a substrate is processed in the deposition apparatus.

Also disclosed herein is a showerhead assembly of a deposition apparatus for processing substrates. The showerhead assembly includes a face plate and back plate. The back plate has a first gas inlet and a second gas inlet. The face plate includes a lower wall and an outer wall extending vertically upwardly from an outer periphery of the lower wall. The outer wall is sealed to an outer periphery of the back plate such that an inner plenum and an edge plenum are formed between the face plate and the back plate. The face plate includes a first gas permeable region in fluid communication with the first gas inlet via the inner plenum such that a first gas supplied into the first gas inlet during processing may be supplied through the first gas permeable region when the showerhead assembly is mounted in a deposition apparatus and a second gas permeable region in fluid communication with the second gas inlet via the edge plenum such that a second gas supplied into the second gas inlet during processing may be supplied through the second gas permeable region when the showerhead assembly is mounted in a deposition apparatus. The inner and edge plenums are not in fluid communication with each other.

Further disclosed herein is a method of depositing material on an upper surface of a substrate in a deposition apparatus. The method comprises supporting a substrate on an, upper surface of a substrate pedestal assembly that is disposed in a vacuum chamber of the deposition apparatus. A first gas is supplied from a first gas source through a showerhead assembly to an inner processing zone of the vacuum chamber that is above an upper surface of the substrate. The first gas is supplied to the inner processing zone via an inner plenum of the showerhead assembly. The inner plenum is in fluid communication with a first group of gas injection holes that extend through an upper surface and a lower surface of a lower wall of a face plate of the showerhead assembly such that the first gas is supplied to the inner processing zone above the upper surface of the substrate.

A second gas is simultaneously supplied from a second gas source through the showerhead assembly to an outer processing zone of the vacuum chamber above the upper surface of the substrate. The second gas is supplied to the outer processing zone via an edge plenum of the showerhead assembly. The edge plenum is in fluid communication with a second group of gas injection holes that extend through an upper surface of an outer wall that extends vertically upward from an outer periphery of the lower wall and the lower surface of the lower wall of the face plate of the showerhead assembly such that the second gas is supplied to the outer processing zone above the upper surface of the substrate. The first or the first and second gases are energized into plasma wherein the plasma generated from the first gas is locally modified with the supply of the second gas and material is uniformly deposited on the upper surface of the substrate.

Additionally disclosed herein is a method of depositing material on an upper surface of a substrate in a deposition apparatus. The method comprises supporting a substrate on an upper surface of a substrate pedestal assembly that is disposed in a vacuum chamber of the deposition apparatus. A first gas is supplied to an inner zone of the vacuum chamber. The first gas is energized into plasma. A second gas is supplied to an edge zone of the vacuum chamber to modulate the plasma in the vicinity of an edge region of the substrate being processed so as to alter the rate of deposition of material on the edge region of the substrate.

DETAILED DESCRIPTION

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, well-known processes, procedures, and/or components have not been described in detail so as not to unnecessarily obscure aspects of embodiments disclosed herein. Like numerals in the figures indicate like elements. As used herein the term "about" refers to ±10%.

Disclosed herein is an edge plenum showerhead assembly that is operable to alter gas composition at an outer edge of a substrate being processed. As used herein gas includes one or more gases or vapors, and/or gas/vapor mixtures. The edge plenum showerhead assembly includes an inner plenum and an edge plenum that are in fluid communication with respective first and second gas sources operable to supply a process gas, tuning gas, purge gas, and/or combination thereof. Preferably, the first gas source is operable to supply a gas (e.g., gaseous or vapor mixture) which may be energized into plasma in a vacuum chamber of a deposition apparatus such that a plasma deposition process may be performed on an upper surface of a substrate. Preferably the second gas source is operable to supply a second gas such as an inert tuning gas or gas mixture to the edge plenum wherein the second gas may enhance or suppress plasma and/or plasma chemistry at the edge of a plasma processing zone of the vacuum chamber. Gases that may be supplied by the second gas source include, but are not limited to, helium, argon, nitrogen, oxygen, xenon, krypton, neon and combinations thereof.

The inner plenum is operable to supply the first gas to an inner processing zone region above a central portion of a substrate being processed and the edge plenum is operable to supply gas to an outer (edge) processing zone above an edge portion of the substrate being processed. In this manner, film properties in the vicinity of the edge portion of a substrate may be controlled during a deposition process by controlling the ratio of gas supplied to the inner and outer processing zones. Furthermore, separate gas compositions and flow rates may be respectively supplied to the inner processing zone and outer processing zone so as to control characteristics of gas flow supplied through the showerhead assembly, plasma characteristics if the gas is energized to form a plasma, and reactive gas concentration as a function of location. Preferably, the second gas is supplied to the edge zone of the vacuum chamber to modulate plasma in the vicinity of an edge region of a substrate being processed. As used herein modulating plasma includes altering an ion flux, energy, or species of the plasma and/or ions, neutrals, radials or components thereof.

Figure 1:
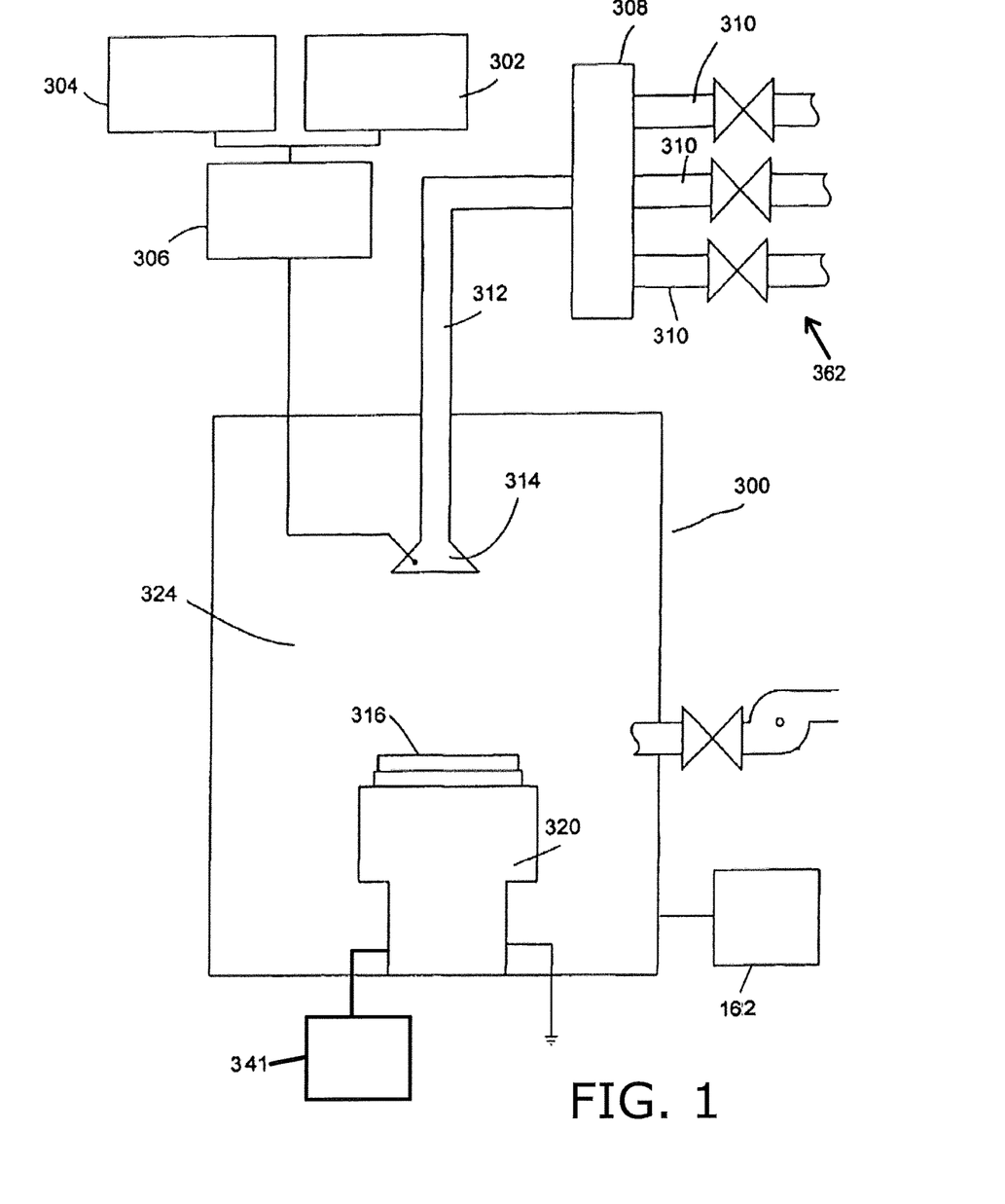
FIG. 1 illustrates a schematic diagram showing an overview of a deposition apparatus in accordance with embodiments disclosed herein.

Embodiments disclosed herein are preferably implemented in a deposition apparatus such as a plasma-enhanced chemical deposition apparatus (i.e. PECVD apparatus, PEALD apparatus, or PEPDL apparatus), however, they are not so limited. FIG. 1 provides a simple block diagram depicting various substrate plasma processing apparatus components arranged for implementing embodiments as disclosed herein. As shown, a substrate plasma processing apparatus 300 includes a vacuum chamber 324 that serves to contain plasma in a processing zone, which is generated by a capacitor type system including a showerhead assembly 314 having an upper RF electrode (not shown) therein working in conjunction with a substrate pedestal assembly 320 having a lower RF electrode (not shown) therein. At least one RF generator is operable to supply RF energy into a processing zone above an upper surface of a substrate 316 in the vacuum chamber 324 to energize gas supplied into the processing zone of the vacuum chamber 324 into plasma such that a plasma deposition process may be performed in the vacuum chamber 324. For example, a high-frequency RF generator 302 and a low-frequency RF generator 304 may each be connected to a matching network 306, which is connected to the upper RF electrode of the showerhead assembly 314 such that RF energy may be supplied to the processing zone above the substrate 316 in the vacuum chamber 324.

The power and frequency of RF energy supplied by matching network 306 to the interior of the vacuum chamber 324 is sufficient to generate plasma from the gas. In an embodiment both the high-frequency RF generator 302 and the low-frequency RF generator 304 are used, and in an alternate embodiment, just the high-frequency RF generator 302 is used. In a process, the high-frequency RF generator 302 may be operated at frequencies of about 2-100 MHz; in a preferred embodiment at 13.56 MHz or 27 MHz. The low-frequency RF generator 304 may be operated at about 50 kHz to 2 MHz; in a preferred embodiment at about 350 to 600 kHz. The process parameters may be scaled based on the chamber volume, substrate size, and other factors. Similarly, the flow rates of gas, may depend on the free volume of the vacuum chamber or processing zone.

An upper surface of the substrate pedestal assembly 320 supports a substrate 316 during processing within the vacuum chamber 324. The substrate pedestal assembly 320 can include a chuck to hold the substrate and/or lift pins to raise and lower the substrate before, during and/or after the deposition and/or plasma treatment processes. In an alternate embodiment, the substrate pedestal assembly 320 can include a carrier ring to raise and lower the substrate before, during and/or after the deposition and/or plasma treatment processes. The chuck may be an electrostatic chuck, a mechanical chuck, or various other types of chuck as are available for use in the industry and/or research. Details of a lift pin assembly for a substrate pedestal assembly including an electrostatic chuck can be found in commonly-assigned U.S. Pat. No. 8,840,754, which is incorporated herein by reference in its entirety. Details of a carrier ring for a substrate pedestal assembly can be found in commonly-assigned U.S. Pat. No. 6,860,965, which is incorporated herein by reference in its entirety. A backside gas supply 341 is operable to supply a heat transfer gas or purge gas through the substrate pedestal assembly 320 to a region below a lower surface of the substrate during processing. The substrate pedestal assembly 320 can include a lower RF electrode therein wherein the lower RF electrode is preferably grounded during processing, however in an alternate embodiment, the lower RF electrode may be supplied with RF energy during processing.

To process a substrate in the vacuum chamber 324 of the substrate plasma processing apparatus 300, gases are introduced from a gas source 362 into the vacuum chamber 324 via inlet 312 and showerhead assembly 314 wherein the gas is formed into plasma with RF energy such that a film may be deposited onto the upper surface of the substrate. In an embodiment, the gas source 362 can include multiple gas lines 310 that are connected to a heated manifold 308. The gases may be premixed or supplied separately to the chamber. Appropriate valving and mass flow control mechanisms are employed to ensure that the correct gases are delivered through the showerhead assembly 314 during substrate processing. During the processing, a backside heat transfer gas or purge gas is supplied to a region below a lower surface of the substrate supported on the substrate pedestal assembly 320. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 162 is employed to control process conditions during deposition, post deposition treatments, and/or other process operations. The controller 162 will typically include one or more memory devices and one or more processors. The processor may include a CPU or computer, analog and/or digital input/output connections, stepper motor controller boards, etc.

In certain embodiments, the controller 162 controls all of the activities of the apparatus. The system controller 162 executes system control software including sets of instructions for controlling the timing of the processing operations, frequency and power of operations of the low-frequency RF generator 304 and the high-frequency RF generator 302, flow rates and temperatures of precursors and inert gases and their relative mixing, temperature of a substrate 316 supported on an upper surface of the substrate pedestal assembly 320 and a plasma exposed surface of the showerhead assembly 314, pressure of the vacuum chamber 324, and other parameters of a particular process. Other computer programs stored on memory devices associated with the controller may be employed in some embodiments.

Typically there will be a user interface associated with controller 162. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the substrate, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the vacuum chamber 324.

Figure 2A:
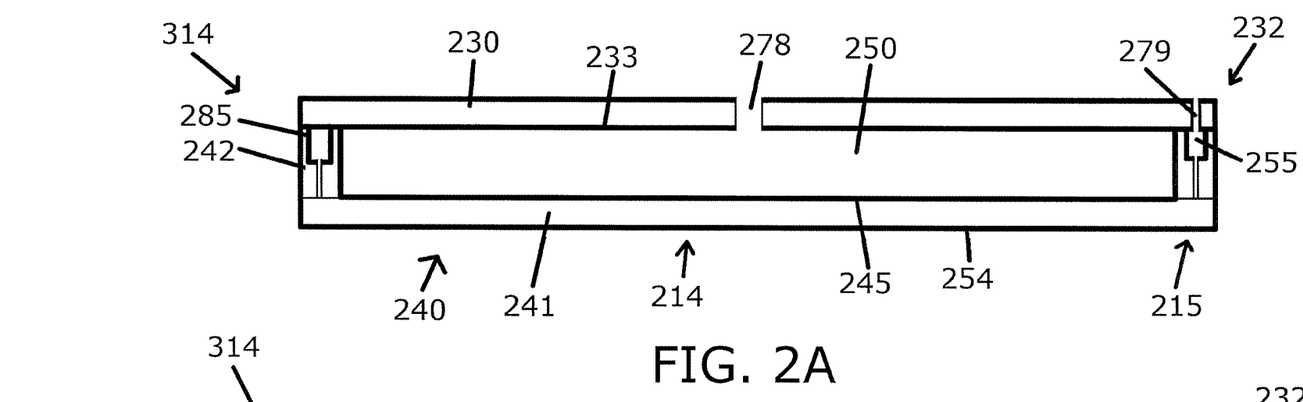
FIG. 2A illustrates an embodiment of a showerhead assembly of a deposition apparatus as disclosed herein.
Figure 2B:
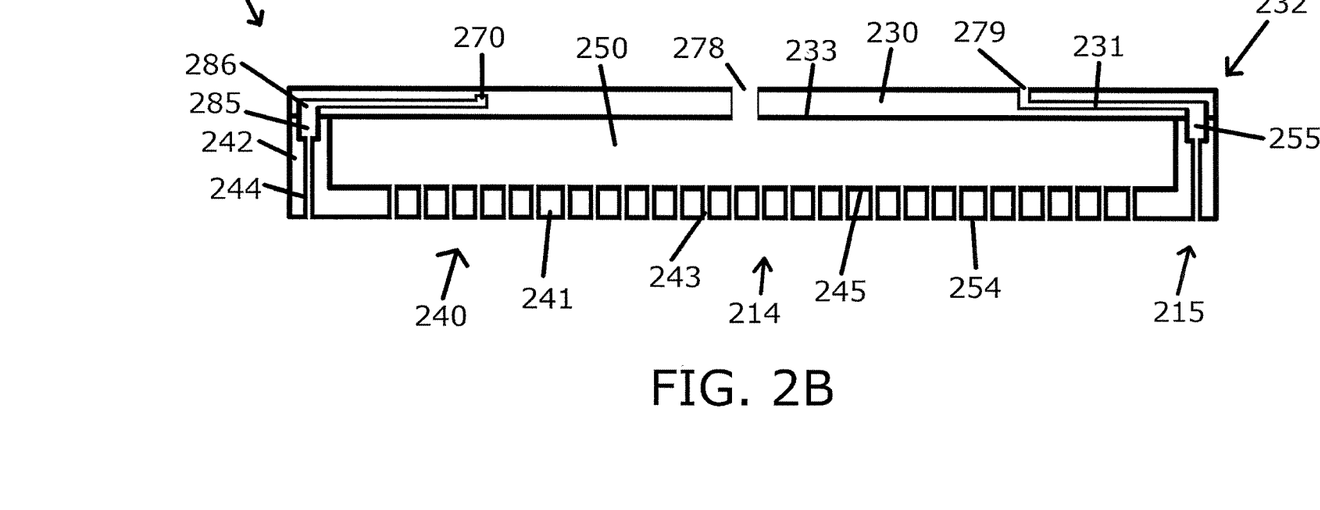
FIG. 2B illustrates an embodiment of a showerhead assembly of a deposition apparatus as disclosed herein.

FIGS. 2A and 2B illustrate cross sections of embodiments of an edge plenum showerhead assembly (showerhead assembly) 314 as disclosed herein. Referring to both FIGS. 2A and 2B, the showerhead assembly 314 includes a face plate 240 and back plate 230. The back plate 230 has a first gas inlet 278 and a second gas inlet 279 through which respective first and second gases may be supplied to the showerhead assembly 314. The face plate 240 has a lower wall 241 and an outer wall 242 extending vertically upwardly from an outer periphery of the lower wall 241. The outer wall 242 can be sealed to an outer periphery 232 of the back plate 230 such that an inner plenum 250 and an edge plenum 255 are formed between the face plate 240 and the back plate 230. The outer periphery 232 of the back plate 230 is preferably metallurgically bonded (i.e. welded, brazed, diffusion bonded, or the like) to the outer wall 242 of the face plate 240. The outer wall 242 may be metallurgically bonded (i.e. welded, brazed, diffusion bonded, or the like) to the lower wall 241, or alternatively, the face plate 240 can be fabricated as a single piece.

The face plate 240 includes a first gas permeable region 214 in fluid communication with the first gas inlet 278 via the inner plenum 250 such that the first gas may be supplied therethrough during processing of a substrate and a second gas permeable region 215 in fluid communication with the second gas inlet 279 via the edge plenum 255 such that a second gas may be supplied therethrough during processing of a substrate. In an embodiment, as illustrated in FIG. 2A, the first and second gas permeable regions 214, 215 are formed in the lower wall 241 of the face plate 240 wherein the lower wall 241 is made of a porous metal material, a porous semiconducting material, or a porous ceramic material such that first and second gases supplied to the respective inner and edge plenums, which are in fluid communication with the lower wall 241, may be supplied therethrough. In an embodiment, the lower wall 241 can be formed of porous aluminum that is metallurgically bonded to the outer wall 242.

In an alternate embodiment, as shown in FIG. 2B, the first gas permeable region 214 can include a first group of gas injection holes 243 extending through an upper surface 245 and a lower surface 254 of the lower wall 241 and the second gas permeable region 215 can include a second group of gas injection holes 244 extending through an upper surface of the outer wall 242 and the lower surface 254 of the lower wall 241. The first gas inlet 278 of the back plate 230 is in fluid communication with the first group of gas injection holes 243 via the inner plenum 250, and the second gas inlet 279 is in fluid communication with the second group of gas injection holes 244 via the edge plenum 255. The inner and edge plenums 250, 255 are not in fluid communication with each other, and the first group of gas injection holes 243 and the second group of gas injection holes 244 are not spatially-interlaced.

In an embodiment, as shown in FIG. 2A, the second gas inlet 279 may be located in the outer periphery 232 of the back plate 230 such that a second gas may be supplied to the edge plenum 255. In an embodiment, the second gas may be supplied to the edge plenum 255 by two or more second gas inlets 279. In an alternate embodiment, as shown in FIG. 2B, the second gas inlet 279 may be located transversely inward of the outer periphery 232 of the back plate 230 wherein the back plate 230 includes at least one transversely extending gas passage 231 that is in fluid communication with the second gas inlet 279 and the edge plenum 255. Preferably, in this embodiment, the second gas inlet 279 is in fluid communication with the at least four transversely extending gas passages 231 via a diffuser 270 that is operable to reduce a pressure differential between gas flowing through each of the transversely extending gas passages 231 of the back plate 230 when gas is supplied thereto via the second gas inlet 279.

In an embodiment, as shown in FIG. 2A, the outer wall 242 of the face plate 240 can include an annular channel 285 in the upper surface thereof wherein the edge plenum 255 is formed between surfaces of the annular channel 285 and an outer lower surface 233 of the back plate 230. In an alternate embodiment, as shown in FIG. 2B, the outer wall 242 of the face plate 240 can include the annular channel 285 in the upper surface thereof and the back plate 230 can include an opposed annular channel 295 in an outer lower surface 233 thereof wherein the edge plenum 255 comprises an annular space between surfaces of the opposed annular channels 285, 295.

Figure 3A:
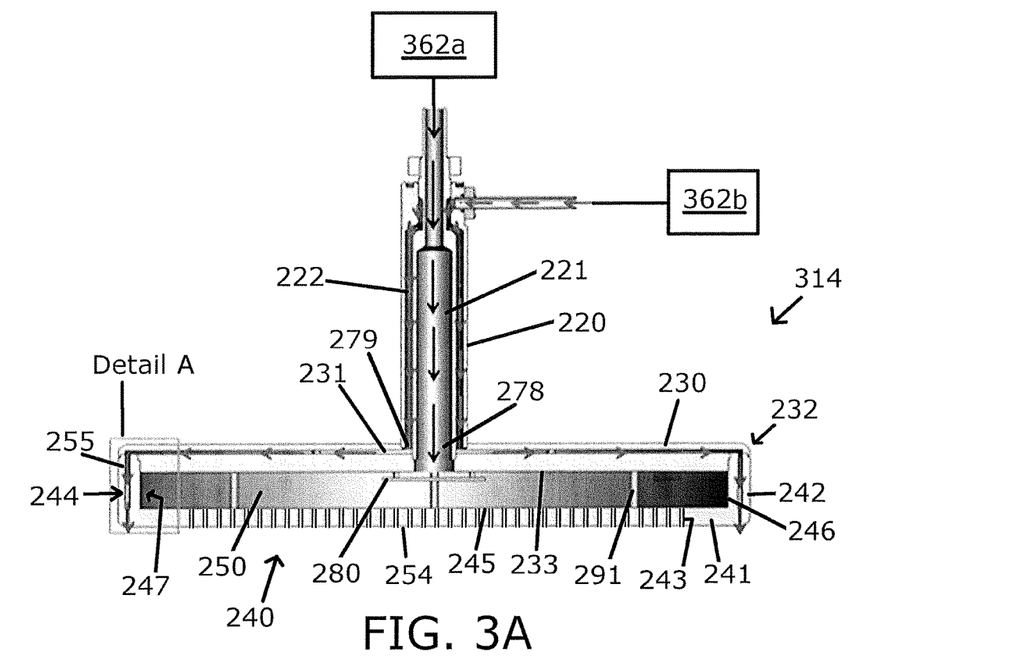
FIG. 3A illustrates an embodiment of a showerhead assembly of a deposition apparatus as disclosed herein.
Figure 3B:
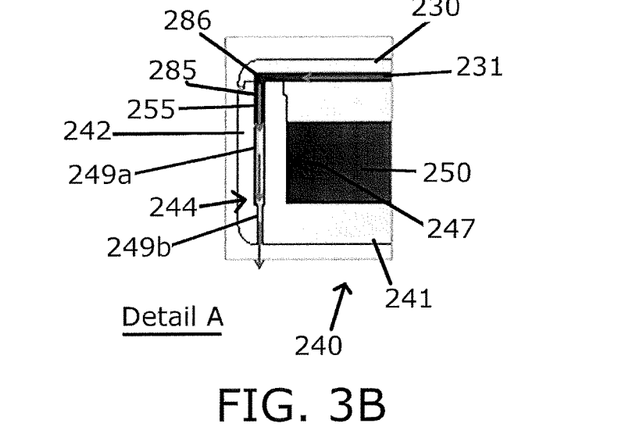
FIG. 3B shows detail A of FIG. 3A.
Figure 4:
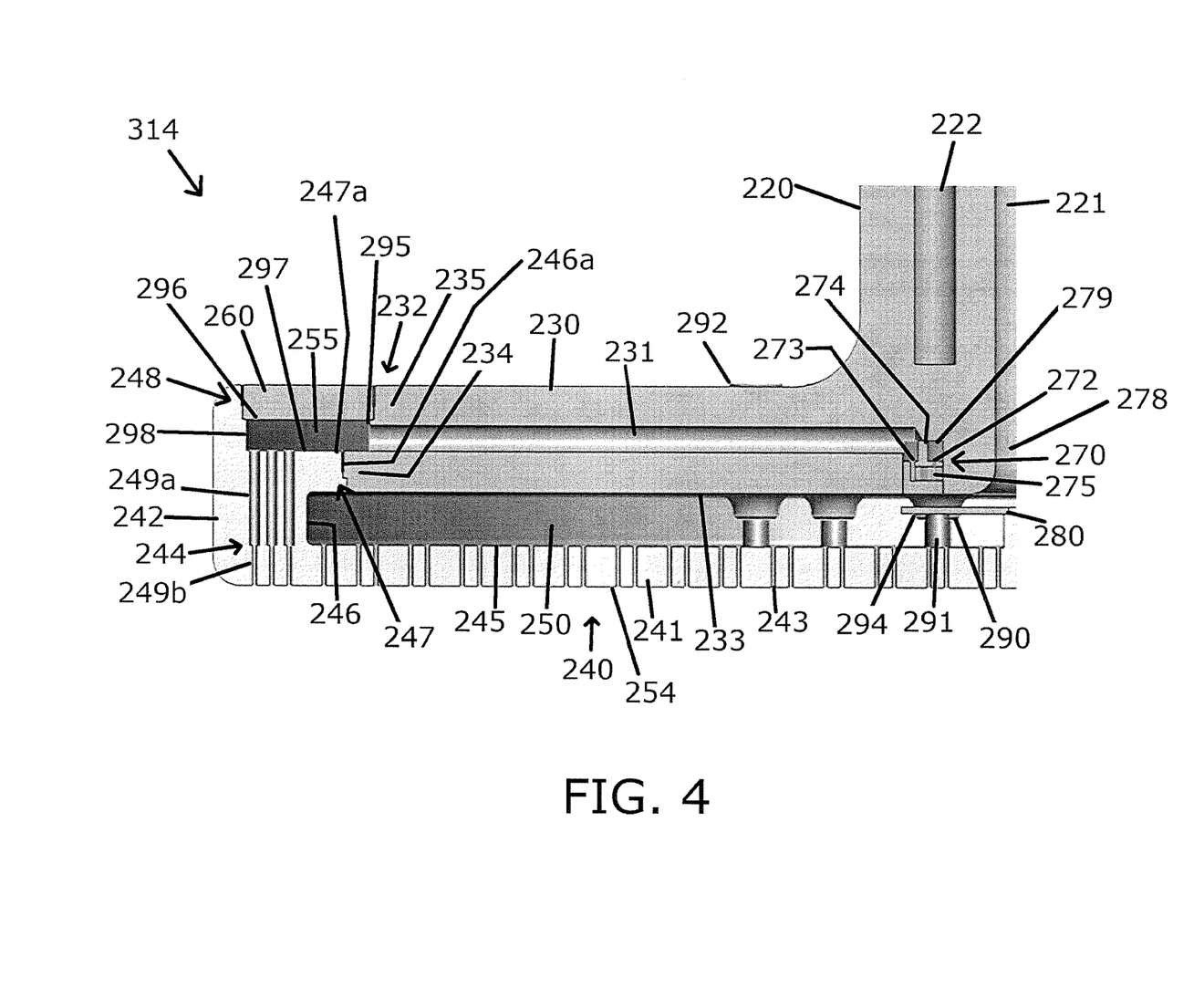
FIG. 4 illustrates an embodiment of a showerhead assembly of a deposition apparatus as disclosed herein.

FIGS. 3A, 3B, and 4 illustrate cross sections of embodiments of an edge plenum showerhead assembly (showerhead assembly) 314 as disclosed herein wherein the edge plenum showerhead assembly 314 includes a stem 220. The stem 220 of the showerhead assembly 314 has a first gas passage 221 extending vertically therethrough that is in fluid communication with a first gas inlet 278 of a back plate 230. In an embodiment, the stem 220 can also include a second gas passage 222 extending vertically therethrough that is in fluid communication with a second gas inlet 279 of the back plate 230. When the showerhead assembly 314 is mounted in a vacuum chamber of a deposition apparatus, the first gas passage 221 is in fluid communication with a first gas source 362a such that a first gas may be supplied through the showerhead assembly 314 to the vacuum chamber and the second gas passage 222 is in fluid communication with a second gas source 362b such that a second gas may be supplied through the showerhead assembly 314 to the vacuum chamber.

The back plate 230 extends transversely outward from a lower end of the stem 220. In an embodiment, the back plate 230 and the stem 220 can be formed as a monolithic piece, or alternatively, the back plate 230 may be metallurgically bonded (i.e. welded, brazed, or diffusion bonded) to the lower end of the stem 220 wherein the back plate 230 can include a first gas inlet 278 that is in fluid communication with the first gas passage 221 of the stem 220. The back plate 230 includes at least one transversely extending gas passage 231 in fluid communication with second gas passage 222 of the stem 210 via a second gas inlet 279. Preferably, the back plate 230 includes at least four transversely extending gas passages 231, at least six transversely extending gas passages 231, at least eight transversely extending gas passages, or at least ten transversely extending gas passages 231. Preferably the transversely extending gas passages 231 are spaced equidistantly around the back plate 230.

The showerhead assembly 314 includes a face plate 240 including a lower wall 241 and an outer wall 242 that extends vertically upwardly from an outer periphery of the lower wall 241 wherein the outer wall includes an inner surface 247. The axial thickness of the outer wall 242 (i.e., height) is greater than the axial thickness of the lower wall 241 inward of the outer wall 242. Preferably, the axial thickness of the outer wall 242 is at least two times greater than the axial thickness of the lower wall 241 inward of the outer wall 242. The lower wall 241 preferably has a uniform axial thickness inward of the outer wall 242. The outer wall 242 is sealed to an outer periphery 232 of the back plate 230 such that an inner plenum 250 and an edge plenum 255 are formed between the face plate 240 and the back plate 230. Preferably the outer wall 242 is metallurgically bonded to the outer periphery 232 of the back plate 230. The face plate 240 includes a first group of gas injection holes 243 that extend through a lower surface 254 and an upper surface 245 of the lower wall 241 and a second group of gas injection holes 244 extending through an upper surface of the outer wall 242 and the lower surface 254 of the lower wall 241. The first gas passage 221 of the stem 220 is in fluid communication with the first group of gas injection holes 243 via the inner plenum 250, and the at least one transversely extending gas passage 231 is in fluid communication with the second group of gas injection holes 244 via the edge plenum 255. The inner plenum 250 is not in fluid communication with the edge plenum 255.

The inner plenum 250 is located between a lower surface 233 of the back plate 230, an upper surface 245 of the lower wall 241 of the face plate 240, and a lower inner surface 246 of the inner surface 247 of the outer wall 242 of the face plate 240. Referring to FIG. 3B, the outer wall 242 can include an annular channel 285 in the upper surface thereof wherein the edge plenum 255 is formed between surfaces of the annular channel 285 and an outer lower surface 233 of the back plate 230. In an alternate embodiment, the back plate 230 can include an opposed annular channel 286 in the outer lower surface 233 thereof wherein the edge plenum 255 comprises an annular space between surfaces of the opposed annular channels 285, 286.

In a further embodiment, as illustrated in FIG. 4, the inner surface 247 of the outer wall 242 can include an upper vertical surface 298, a lower vertical surface 246a, and a horizontal surface 297 extending therebetween. The edge plenum 255 is formed between an outer surface of the back plate 295, a lower surface of a cover plate 296, the horizontal surface 297, and the upper vertical surface 298. In an embodiment, the lower inner surface 246 of the outer wall 242 can be transversely outward of the lower vertical surface 246a so as to form a flange 247a that mates with and may be metallurgically bonded (e.g., welded) to a lower portion 234 of the back plate 230. The cover plate 260 can be sealed to an upper end 248 of the outer wall 242 and an upper portion 235 of the outer periphery 232 of the back plate 230. Preferably the cover plate 260 is metallurgically bonded (e.g., welded) to the upper end 248 of the outer wall 242 and the upper portion 235 of the outer periphery 232 of the back plate 230.

Referring back to FIGS. 3A, 3B, and 4, an upper portion 249a of each gas injection hole of the second group of gas injection holes 244 has a diameter greater than respective lower portions 249b. In an embodiment, the length of the respective lower portions 249b of each gas injection hole of the second group of gas injection holes 244 can be at least about the same as the length of each gas injection hole of the first group of gas injection holes 243. In an embodiment, the diameter of each of the respective lower portions 249b of each gas injection hole of the second group of gas injection holes 244 can be at least about the same as the diameter of each of the respective gas injection holes of the first group of gas injection holes 243.

The face plate 240 preferably includes a plurality of posts 291 in the inner plenum 250 that extend vertically upwardly from the lower wall 241 wherein upper ends of the posts 291 are welded in corresponding openings 292 (see FIG. 4) of the back plate 230 in which the upper ends of the posts 291 are located. A baffle 280 is preferably disposed in the inner plenum 250 of the showerhead assembly 314. The baffle 280 is operable to evenly distribute gas supplied to the showerhead assembly 314 throughout the inner plenum 250. The face plate 240, back plate 230, and stem 220 are preferably formed from aluminum.

Referring now to FIG. 4, the back plate 230 can include a diffuser 270 metallurgically bonded (e.g., welded) in a recess in a lower surface 233 thereof. The diffuser 270 is in fluid communication with the second gas passage 222 of the stem 220 and the transversely extending gas passages 231 of the back plate 230. The diffuser 270 is operable to evenly supply gas from the second gas passage 222 of the stem 220 to the transversely extending gas passages 231 so as to reduce a pressure differential between gas flowing through each of the transversely extending gas passages 231 of the back plate 230 when gas is supplied thereto from the second gas passage 222 of the stem 220.

The diffuser 270 includes an upper surface having a group of inner gas openings 272 in fluid communication with the second gas passage 222 of the stem 220 and a group of outer gas openings 273 in fluid communication with the respective transversely extending gas passages 231 of the back plate 230. The group of inner gas openings 272 is separated from the group of outer gas openings 273 by a wall 274 that extends vertically upwardly from the upper surface of the diffuser. The group of inner gas openings 272 is in fluid communication with the group of outer gas openings 273 via a channel 275 of the diffuser 270 that is below the upper surface thereof. The group of inner gas openings 272 and the group of outer gas openings 273 are configured to reduce a pressure differential between gas flowing through each of the transversely extending gas passages 231 of the back plate 230 when gas is supplied thereto from the second gas passage 222 of the stem 220.

In an embodiment, the diffuser 270 can be a C-shaped ring. The space between opposed ends of the C-shaped ring are arranged to surround a portion of back plate 230 that includes a temperature probe therein. Preferably, the portion of the back plate 230 that includes the temperature probe therein forms a socket 290 that includes an upper portion of a post 291 is welded therein. The temperature probe is in thermal communication with the upper portion of the post 291 such that the temperature of the lower wall 241 may be measured. In an embodiment, the baffle 280 disposed in the inner plenum 250 can include a carve out 294 that surrounds the socket 290 of the back plate 230.

Figure 5A:
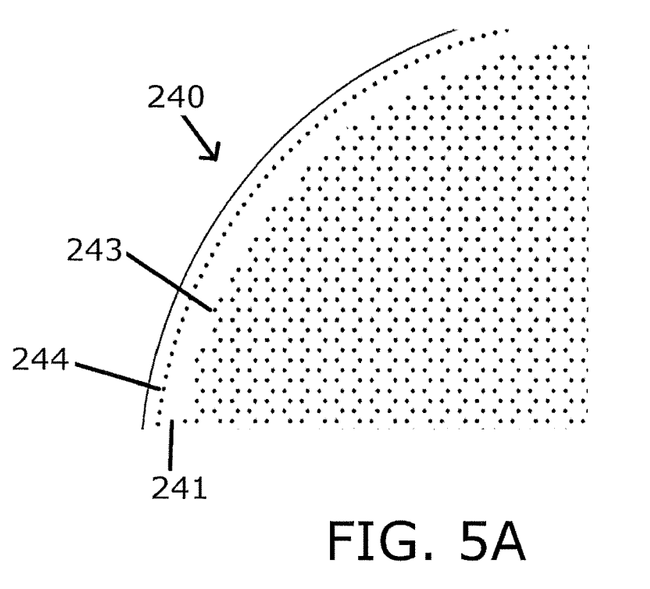
FIGS. 5A and 5B each illustrate a portion of an exposed surface of a lower wall of a face plate according to embodiments as disclosed herein.
Figure 5B:
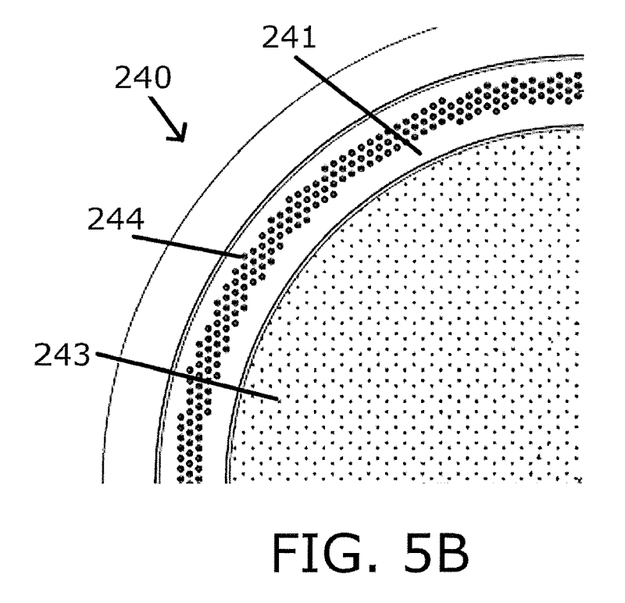

In an embodiment, the first group of gas injection holes 243 in the lower wall 241 of the face plate 240 may be arranged in concentric rows (see FIG. 1). In a preferred embodiment, as illustrated in FIG. 5A, the first group of gas injection holes 243 in the lower wall 241 of the face plate 240 may be arranged a hexagonal pattern. The second group of gas injection holes 244 may be arranged in one or more concentric rows. In an alternate embodiment, as illustrated in FIG. 5B, the second group of gas injection holes 244 can be arranged in a hexagonal pattern. The gas injection hole patterns, areal gas injection hole density, and dimensions of the gas injection holes of the first group of gas injection holes 243 and the second group of gas injection holes 244 can be predetermined for a given process to be performed. In an embodiment, the first group of gas injection holes 243 includes about 3,000-20,000 or more gas injection holes and the second group of gas injection holes 244 includes about 100 to about 2,000 or more gas injection holes.

Further disclosed herein is a method of depositing material on an upper surface of a substrate in a deposition apparatus. The method comprises supporting a substrate on an upper surface of a substrate pedestal assembly that is disposed in a vacuum chamber of the deposition apparatus. A first gas is supplied from a first gas source through a showerhead assembly to an inner processing zone of the vacuum chamber that is above an upper surface of the substrate. The first gas is supplied to the processing zone via an inner plenum of the showerhead assembly. The inner plenum is in fluid communication with a first group of gas injection holes that extend through an upper and lower surface of a lower wall of a face plate of the showerhead assembly such that the first gas can be supplied to the inner processing zone above the upper surface of the substrate.

A second gas is simultaneously supplied from a second gas source through the showerhead assembly to the processing zone of the vacuum chamber above the upper surface of the substrate. The second gas is supplied to an outer processing zone via an edge plenum of the showerhead assembly. The edge plenum is in fluid communication with a second group of gas injection holes that extend through an upper surface of an outer wall that extends vertically upward from an outer periphery of the lower wall and a lower surface of the lower wall of the face plate of the showerhead assembly such that the second gas can be supplied to an outer region of the outer processing zone above the upper surface of the substrate. The first or the first and second gases are energized into plasma wherein the plasma generated from the first gas is locally modified with the supply of the second gas and material is uniformly deposited on the upper surface of the substrate. Locally modifying the plasma generated from the first gas in the outer processing zone with the supply of the second gas preferably includes enhancing or suppressing the plasma generated in the outer processing zone by supplying one or more inert gases to the outer processing zone or supplying an inert tuning gas to the outer processing zone.

Also disclosed herein is a method of depositing material on an upper surface of a substrate in a deposition apparatus. The method comprises supporting a substrate on an upper surface of a substrate pedestal assembly that is disposed in a vacuum chamber of the deposition apparatus. A first gas is supplied to an inner zone of the vacuum chamber. The first gas is energized into plasma. A second gas is supplied to an edge zone of the vacuum chamber to modulate the plasma in the vicinity of an edge region of the substrate being processed so as to alter the rate of deposition of material on the edge region of the substrate. Preferably, the majority of the effect of the modulation of the plasma occurs within the outer 25% of the lateral extent of the substrate. More preferably, the plasma is modulated above the outer 20% of the lateral extent of the substrate. Modulation of the plasma includes altering an ion flux, energy, or species of the plasma and/or ions, neutrals, radials or components thereof.

Embodiments disclosed herein have been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way.

What is claimed is:

1. A deposition apparatus for processing a substrate, the deposition apparatus comprising:
   a vacuum chamber including a processing zone in which a substrate may be processed;

first and second gas sources in fluid communication with the vacuum chamber, the first gas source operable to supply a first gas into the vacuum chamber during processing and the second gas source operable to supply a second gas into the vacuum chamber during processing;

a showerhead assembly, the showerhead assembly including: a face plate and back plate, the back plate including a first gas inlet in fluid communication with the first gas source and a second gas inlet in fluid communication with the second gas source; the face plate including a lower wall and an outer wall extending vertically upwardly from an outer periphery of the lower wall, the outer wall sealed to an outer periphery of the back plate such that an inner plenum and an outer annular edge plenum are formed between the face plate and the back plate, the face plate including a first gas permeable region in fluid communication with the first gas inlet via the inner plenum such that the first gas may be supplied therethrough during processing and a second gas permeable region in fluid communication with the second gas inlet; and a substrate pedestal assembly configured to support a substrate on an upper surface thereof when a substrate is processed in the deposition apparatus;

wherein the back plate includes at least four transversely extending gas passages in fluid communication with the outer annular edge plenum and the second gas inlet via a recess extending circumferentially in the back plate, the recess located between the second gas inlet and the at least four transversely extending gas passages, the recess configured to evenly supply gas from the second gas inlet to the transversely extending gas passages when gas is supplied to the second gas inlet.

2. The deposition apparatus of claim 1, wherein the first gas permeable region comprises a first group of gas injection holes extending through an upper surface and a lower surface of the lower wall and the second gas permeable region comprises a second group of gas injection holes extending through an upper surface of the outer wall and the lower surface of the lower wall.

3. The deposition apparatus of claim 1, wherein the showerhead assembly further comprises a stem wherein the back plate extends transversely outward from a lower end of the stem, the stem having a first gas passage extending vertically therethrough in fluid communication with the first gas inlet, and the stem having a second gas passage extending vertically therethrough in fluid communication with the second gas inlet.

4. The deposition apparatus of claim 1, wherein the inner plenum is between a lower surface of the back plate, an upper surface of the face plate, and a lower inner surface of the outer wall of the face plate; and (a) the outer wall includes a lower vertical surface, an upper vertical surface, and a horizontal surface extending therebetween, and the outer annular edge plenum is formed between an outer surface of the back plate, a lower surface of a cover plate, the horizontal surface, and the upper vertical surface;

(b) the outer wall includes an annular channel in the upper surface thereof and the outer annular edge plenum is formed between surfaces of the annular channel and an outer lower surface of the back plate; or (c) the outer wall includes an annular channel in the upper surface thereof, the back plate includes an opposed annular channel in an outer lower surface thereof, and the outer annular edge plenum comprises an annular space between surfaces of the opposed annular channels.

5. The deposition apparatus of claim 1, wherein the deposition apparatus includes:
(a) an RF energy source adapted to energize the first gas and/or the second gas into a plasma state in the processing zone;
(b) a system controller operable to control processes performed by the deposition apparatus;
(c) a non-transitory computer machine-readable medium comprising program instructions for control of the deposition apparatus; and/or
(d) a vacuum source in fluid communication with the processing zone for evacuating the first and second gas from the processing zone.

6. The deposition apparatus assembly of claim 1, wherein the first gas permeable region comprises a first group of gas injection holes extending through an upper surface and a lower surface of the lower wall and the second gas permeable region comprises a second group of gas injection holes extending through an upper surface of the outer wall and the lower surface of the lower wall, and:
(a) an upper portion of each gas injection hole of the second group of gas injection holes extends vertically and has a diameter greater than respective lower portions thereof wherein the length of the respective lower portions is at least about the same as the length of each gas injection hole of the first group of gas injection holes and the diameter of each of the respective lower portions is at least about the same as the diameter of each of the respective gas injection holes of the first group of gas injection holes;
(b) an upper portion of each of the second group of gas injection holes has a diameter greater than a lower portion thereof;
(c) the first group of gas injection holes is arranged in a hexagonal pattern;
(d) the first group of gas injection holes is arranged in concentric rows;
(e) the second group of gas injection holes is arranged in one or more concentric rows;
(f) the second group of gas injection holes is arranged in a hexagonal pattern;
(g) the first group of gas injection holes includes about 3,000 to 20,000 gas injection holes; or
(h) the second group of gas injection holes includes about 100 to 2,000 gas injection holes.

7. The deposition apparatus of claim 1, further comprising a diffuser located in the recess and operable to reduce a pressure differential between gas flowing through each of the transversely extending gas passages of the back plate when gas is supplied thereto via the second gas inlet.

8. The deposition apparatus of claim 7, wherein the diffuser includes an upper surface having a group of inner gas openings in fluid communication with the second gas inlet and a group of outer gas openings in fluid communication with the at least four transversely extending gas passages of the back plate wherein the group of inner gas openings is separated from the group of outer gas openings by a wall, the group of inner gas openings in fluid communication with the group of outer gas openings via a channel of the diffuser that is below the upper surface thereof, wherein the group of inner gas openings and the group of outer gas openings are configured to reduce a pressure differential between gas flowing through each of the transversely extending gas passages of the back plate when gas is supplied thereto from the second gas inlet.

9. The deposition apparatus of claim 1, wherein:
(a) the face plate includes a plurality of posts in the inner plenum extending vertically upwardly from the lower wall thereof wherein upper ends of the posts are welded in corresponding openings of the back plate in which the upper ends of the posts are located;
(b) the face plate includes an RF electrode embedded therein;
(c) a baffle is disposed in the inner plenum of the showerhead assembly wherein the baffle is operable to evenly distribute gas supplied to the showerhead assembly throughout the inner plenum;
(d) the axial thickness of the outer wall is at least two times greater than the axial thickness of the lower wall inward of the outer wall; and/or
(e) the outer wall of the face plate is metallurgically bonded to the outer periphery of the back plate.

10. A showerhead assembly of a deposition apparatus for processing a substrate, the showerhead assembly comprising:
a face plate and back plate;
the back plate including a first gas inlet and a second gas inlet;
the face plate including a lower wall and an outer wall extending vertically upwardly from an outer periphery of the lower wall, the outer wall sealed to an outer periphery of the back plate such that an inner plenum and an outer annular edge plenum are formed between the face plate and the back plate, the face plate including a first gas permeable region in fluid communication with the first gas inlet via the inner plenum such that a first gas supplied into the first gas inlet during processing may be supplied through the first gas permeable region when the showerhead assembly is mounted in a deposition apparatus and a second gas permeable region in fluid communication with the second gas inlet via the outer annular edge plenum such that a second gas supplied into the second gas inlet during processing may be supplied through the second gas permeable region when the showerhead assembly is mounted in a deposition apparatus, the inner edge plenum and the outer annular edge plenum not in fluid communication with each other;
wherein the back plate includes at least four transversely extending gas passages in fluid communication with the outer annular edge plenum and the second gas inlet via a recess extending circumferentially in the back plate, the recess located between the second gas inlet and the at least four transversely extending gas passages, the recess configured to evenly supply gas from the second gas inlet to the transversely extending gas passages when gas is supplied to the second gas inlet.

11. The showerhead assembly of claim 10, wherein the first gas permeable region comprises a first group of gas injection holes extending through an upper surface and a lower surface of the lower wall and the second gas permeable region comprises a second group of gas injection holes extending through an upper surface of the outer wall and the lower surface of the lower wall.

12. The showerhead assembly of claim 10, wherein the showerhead assembly further comprises a stem wherein the back plate extends transversely outward from a lower end of the stem, the stem having a first gas passage extending vertically therethrough in fluid communication with the first gas inlet and a second gas passage extending vertically therethrough in fluid communication with the second gas inlet.

13. The showerhead assembly of claim 10, wherein the inner plenum is between a lower surface of the back plate, an upper surface of the lower wall of the face plate, and a lower inner surface of the outer wall of the face plate; and
(a) the outer wall includes a lower vertical surface, an upper vertical surface, and a horizontal surface extending therebetween, and the outer annular edge plenum is formed between an outer surface of the back plate, a lower surface of a cover plate, the horizontal surface, and the upper vertical surface;
(b) the outer wall includes an annular channel in the upper surface thereof and the outer annular edge plenum is formed between surfaces of the annular channel and an outer lower surface of the back plate; or
(c) the outer wall includes an annular channel in the upper surface thereof, the back plate includes an opposed annular channel in an outer lower surface thereof, and the outer annular edge plenum comprises an annular space between surfaces of the opposed annular channels.

14. The shower head assembly of claim 10, wherein the first gas permeable region comprises a first group of gas injection holes extending through an upper surface and a lower surface of the lower wall and the second gas permeable region comprises a second group of gas injection holes extending through an upper surface of the outer wall and the lower surface of the lower wall, and:
(a) an upper portion of each gas injection hole of the second group of gas injection holes extends vertically and has a diameter greater than respective lower portions thereof wherein the length of the respective lower portions is at least about the same as the length of each gas injection hole of the first group of gas injection holes and the diameter of each of the respective lower portions is at least about the same as the diameter of each of the respective gas injection holes of the first group of gas injection holes;
(b) an upper portion of each of the second group of gas injection holes has a diameter greater than a lower portion thereof;
(c) the first group of gas injection holes is arranged in a hexagonal pattern;
(d) the first group of gas injection holes is arranged in concentric rows;
(e) the second group of gas injection holes is arranged in one or more concentric rows;
(f) the second group of gas injection holes is arranged in a hexagonal pattern;
(g) the first group of gas injection holes includes about 3,000 to 20,000 gas injection holes; or
(h) the second group of gas injection holes includes about 100 to 2,000 gas injection holes.

15. The showerhead assembly of claim 10, further comprising a diffuser located in the recess and operable to reduce a pressure differential between gas flowing through each of the transversely extending gas passages of the back plate when gas is supplied thereto via the second gas inlet.

16. The showerhead assembly of claim 15, wherein the diffuser includes an upper surface having a group of inner gas openings in fluid communication with the second gas inlet and a group of outer gas openings in fluid communication with the at least four transversely extending gas passages of the back plate wherein the group of inner gas openings is separated from the group of outer gas openings by a wall, the group of inner gas openings in fluid communication with the group of outer gas openings via a channel of the diffuser that is below the upper surface thereof, wherein the group of inner gas openings and the group of outer gas openings are configured to reduce a pressure differential between gas flowing through each of the transversely extending gas passages of the back plate when gas is supplied thereto from the second gas inlet.

17. The showerhead assembly of claim 10, wherein
   (a) the face plate includes a plurality of posts in the inner plenum extending vertically upwardly from the lower wall thereof wherein upper ends of the posts are welded in corresponding openings of the back plate in which the upper ends of the posts are located;
   (b) the face plate includes an RF electrode embedded therein;
   (c) a baffle is disposed in the inner plenum of the showerhead assembly wherein the baffle is operable to evenly distribute gas supplied to the showerhead assembly throughout the inner plenum;
   (d) the axial thickness of the outer wall is at least two times greater than the axial thickness of the lower wall inward of the outer wall; and/or
   (e) the outer wall of the face plate is metallurgically bonded to the outer periphery of the back plate.

* * * * *